United States Patent [19]
Stuckert

[11] 3,934,213
[45] Jan. 20, 1976

[54] BROAD BAND DIRECTIONAL COUPLING CIRCUIT

[75] Inventor: Paul E. Stuckert, Katonah, N.Y.

[73] Assignee: International Business Machines Corporation, Armonk, N.Y.

[22] Filed: June 28, 1974

[21] Appl. No.: 484,190

[52] U.S. Cl............... 333/10; 330/124 R; 333/81 R
[51] Int. Cl.² .......................................... H03H 7/48
[58] Field of Search .................. 333/10, 24 R, 81 R; 179/170 R, 170 F, 170 NC, 170 HF

[56] References Cited
UNITED STATES PATENTS

| | | | |
|---|---|---|---|
| 2,395,540 | 2/1946 | Edwards .......................... | 179/170 F |
| 3,611,123 | 10/1971 | Mouw et al. ................... | 333/81 R X |

Primary Examiner—Paul L. Gensler
Attorney, Agent, or Firm—Sughrue, Rothwell, Mion, Zinn & Macpeak

[57] ABSTRACT

A broad band directional coupler including a conventional attenuator is disclosed. The coupler permits detection of signals propagating simultaneously in opposite directions on a single-signal path or transmission line. Detection may occur at one or a multiplicity of ports located at arbitrary positions along the line. In the specific embodiments disclosed, the attenuators employed are symmetrical, $\pi$, O, T, and H attenuator networks. The invention, however, is equally applicable to $\pi$, O, T or H attenuator networks which are not symmetrical. The specific embodiments shown employing active devices have wide frequency responses which are flat and flat to DC. Where operation down to DC is not required and where a broad band directional coupler comprised entirely of passive elements is desired, a version of the coupler circuit employing transformers is disclosed. The circuits described have application in analog and digital communication paths where two-way information flow exists and where a multiplicity of ports may share the same path.

21 Claims, 10 Drawing Figures

BROAD BAND DIRECTIONAL COUPLING CIRCUIT

BACKGROUND OF THE INVENTION

1. Field of the Invention

The present invention generally relates to coupling circuits, and more particularly, to a broad band directional coupling circuit which permits detection of signals propagating simultaneously in opposite directions on a single-signal path or transmission line.

2. Description of the Prior Art

Various types of directional couplers are known in the art and are typically used for splitting or mixing signals on transmission lines or the like. Most directional couplers, however, are narrow or limited-band devices since the coupling network generally employs reactive devices. The use of reactive devices in the coupling network necessarily limits the frequency band of operation of the directional coupler and often unduly complicates the design and construction of the coupler circuit.

SUMMARY OF THE INVENTION

It is therefore an object of the present invention to provide a broad band directional coupling circuit employing only linear and nonreactive circuit components and whose frequency response is flat and flat to DC.

It is another object of the invention to provide an improved broad band directional coupler of uniquely simple construction which permits the detection of signals propagating simultaneously in opposite directions on a single-signal path or transmission line.

It is a further object of the invention to provide a broad band directional coupler comprised entirely of passive elements.

The foregoing and other objects of the invention are attained by providing a directional coupler circuit including a conventional attenuator which operates in conjunction with other circuitry. The attenuator may be a $\pi$, O, T, or H network and may be either balanced, unbalanced, or symmetrical. The attenuator employs all linear, nonreactive circuit elements and is readily adapted to incorporation in coaxial, microstrip and stripline structures, among others. When operation of the directional coupler is required down to DC, differential amplifiers or operational summing amplifiers having very high input impedances, are employed in conjunction with the attenuator networks. If, however, operation to DC is not required, the broad band directional coupler according to the invention can be constructed entirely of passive elements by using transformers.

BRIEF DESCRIPTION OF THE DRAWINGS

The specific nature of the invention, as well as other objects, aspects, uses and advantages thereof, will clearly appear from the following description and from the accompanying drawings, in which.

DESCRIPTION OF THE PREFERRED EMBODIMENTS

Figure 1A:
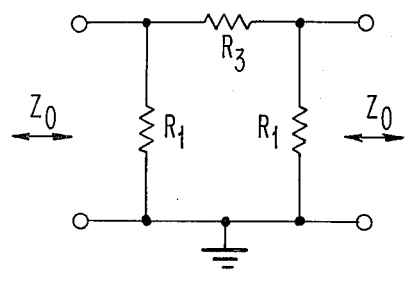
FIGS. 1A and 1B are circuit diagrams of conventional, symmetrical $\pi$ and O attenuator networks, respectively, which are used to illustrate the principles of the invention.
Figure 1B:
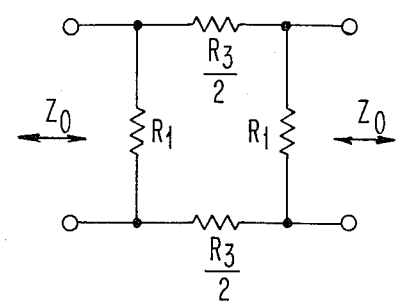

For purposes of illustration only and in the interest of simplicity and clarity, the invention is described as including symmetrical $\pi$, O, T, or H attenuator networks as shown in FIGS. 1A, 1B, 4A, and 4B respectively. In any case, it will be appreciated by those skilled in the art from the following description that the principles of the invention are equally applicable to $\pi$, O, T, and H attenuator networks which are not symmetrical. Referring first to FIGS. 1A and 1B, the series resistance $R_3$ and the shunt resistances $R_1$ are calculated from the following equations:

$$R_3 = Z_0 \left( \frac{K^2 - 1}{2K} \right), \text{ and} \quad (1)$$

$$R_1 = Z_0 \left( \frac{K+1}{K-1} \right), \quad (2)$$

where $Z_0$ is the characteristic impedance of the transmission line, and $K$ is the current or voltage ratio from input to output, hereinafter referred to as the attenuation factor. In the specific embodiments to be described, it is assumed that $Z_0 = 50$ ohms, and $K = E_i/E_0 = 2$ ($\approx$ 6dB) for which $R_1 = \approx 150$ ohms and $R_3 = 37.5$ ohms. As will be seen, the magnitude of the attenuation provided by these attenuators is probably larger than that which would ordinarily be used in most applications; however, these relative values are useful to provide an illustrative numerical example.

Figure 2A:
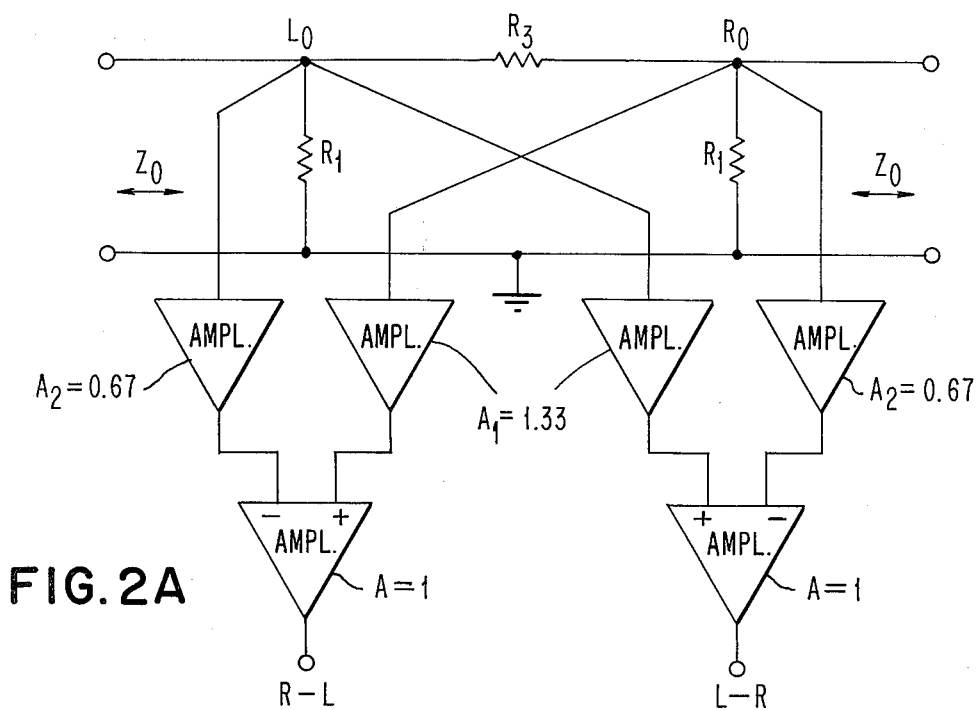
FIG. 2A illustrates one specific embodiment of the invention employing the symmetrical $\pi$ attenuator of FIG. 1A and two amplifier circuits.

Referring now to FIG. 2A, there is shown one specific embodiment of the invention which employs the symmetrical $\pi$ attenuator netowrk of FIG. 1A. The attenuator may be considered a three terminal device having one terminal grounded. The node adjacent the left-hand terminal is labeled $L_o$, while the node adjacent the right-hand terminal is labeled $R_o$. The output terminals or nodes of the directional coupling circuit are labeled R-L and L-R denoting signals propagating from right to left and left to right, respectively. Associated with each output node are a pair of operational amplifiers $A_1$ and $A_2$ whose outputs are combined in a differential amplifier of unit gain which is coupled to the output node. Alternatively, operational amplifiers $A_2$ could be inverting amplifiers, and summing amplifiers could be used in place of the differential amplifiers. Considering first the amplifiers associated with output node R–L, the amplifier with gain $A_1$ has its input connected to node $R_o$, and the amplifier with gain $A_2$ has its input connected to node $L_o$. In like manner with reference to the amplifiers associated with output node L-R, amplifier $A_1$ has its input connected to node $L_o$, and amplifier $A_2$ has its input connected to node $R_o$. Assuming that an output signal magnitude at nodes R-L and L-R equal to the input signal is desired, and assuming the amplifiers to be perfect, the gains $A_1$ and $A_2$ are calculated as follows:

$$A_1 = \frac{K^2}{K^2 - 1}, \text{ and} \quad (3)$$

$$A_2 = \frac{K}{K^2 - 1}, \quad (4)$$

where $K$ is the attenuation factor as before. Thus, for $K = 2$ $A_1 = 1.33$ and $A_2 = 0.67$.

Figure 2B:
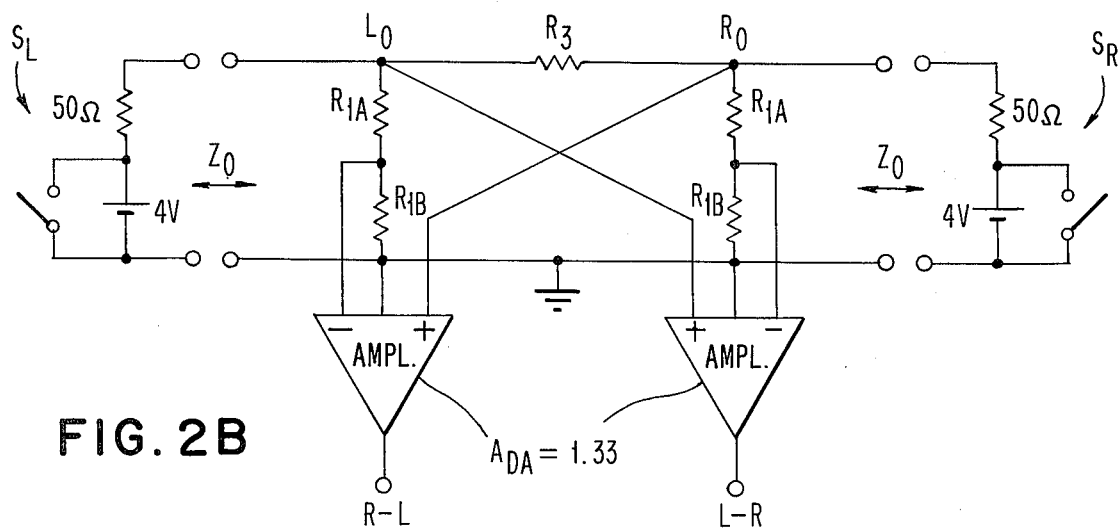
FIG. 2B illustrates another specific embodiment of the invention employing a modified symmetrical $\pi$ attenuator network and a pair of differential amplifiers.

The circuit of FIG. 2A can be simplified by modifying the $\pi$ attenuator network and employing two differential amplifiers as shown in FIG. 2B. For the purpose of this description, the differential amplifiers are assumed to be perfect, i.e., their input impedances are infinite, their output impedances are zero, their gains are constant from DC upwards in frequency, and their delay is zero from DC upwards in frequency. In the circuit shown in FIG. 2B, the shunt impedances of the $\pi$ attenuator are divided into two series impedances, $R_{1A}$ and $R_{1B}$ and calculated as follows:

$$R_{1A} + R_{1B} = R_1 \quad (5)$$

$$R_{1A} = R_{1B}(K-1) \quad (6)$$

$$R_{1A} = R_1 \left(\frac{K-1}{K}\right), \text{ and} \quad (7)$$

$$R_{1B} = R_1 \left(\frac{1}{K}\right). \quad (8)$$

Also, assuming an output signal magnitude at nodes R-L and L-R equal to the input signal is desired, the gain of the differential amplifiers, $A_{DA}$, is calculated as follows:

$$A_{DA} = \frac{K^2}{K^2 - 1} \quad (9)$$

The operation of the circuit shown in FIG. 2B is best visualized by a numerical example. In this example, it is assumed that the sources $S_L$ and $S_R$, which are depicted as an idealized battery and shorting switch connected in series with a resistance equal to the characteristic 50 ohm impedance of the transmission line, can deliver either zero volts or +2 volts to the transmission system depending on whether the switches are either closed or open, respectively. Table I below tabulates the voltages appearing at the several nodes in the $\pi$ attenuator network for all combinations of signals from the sources $S_L$ and $S_R$. In Table I, the source voltages appear in the first two columns, the voltages that occur at the node $L_o$ and the node between the left shunt resistor pair $R_{1A}/R_{1B}$ appear in the next two columns, then the voltages occurring at the node $R_o$ and the node between the right shunt resistor pair $R_{1A}/R_{1B}$ appear in the next two columns. Finally, the voltages which occur at the nodes R-L and L-R, or the outputs of the pair of differential amplifiers, are tabulated in the last two columns of Table I.

TABLE I

| | | | (FIG. 2B) ($R3 = 37.5\Omega$, $R_{1A} + 75\Omega$, $R_{1B} = 75\Omega$) | | | | | |
|---|---|---|---|---|---|---|---|
| $S_L$ | $S_R$ | $L_o$ | $L(R_{1A}/R_{1B})$ | $R_o$ | $R(R_{1A}/R_{1B})$ | R-L | L-R |
| 4v | 0v | 2.0v | 1.0v | 1.0v | 0.5v | 0.0v | 2.0v |
| 0v | 4v | 1.0v | 0.5v | 2.0v | 1.0v | 2.0v | 0.0v |
| 4v | 4v | 3.0v | 1.5v | 3.0v | 1.5v | 2.0v | 2.0v |
| 0v | 0v | 0.0v | 0.0v | 0.0v | 0.0v | 0.0v | 0.0v |

Since all components of the circuit of FIG. 2B are linear and nonreactive and superposition applies, it is obvious that:

1. A signal equal in magnitude and polarity to any signal from $S_L$ propagating from left to right is produced at node L-R.
2. A signal equal in magnitude and polarity to any signal from $S_R$ propagating from right to left is produced at node R-L.
3. No signal appears at node L-R for a signal from $S_R$ propagating from right to left.
4. No signal appears at node R-L for a signal from $S_L$ propagating from left to right.

The circuit shown in FIG. 2B is thus a broad band directional coupling circuit whose frequency response is flat and flat to DC.

Figure 2C:
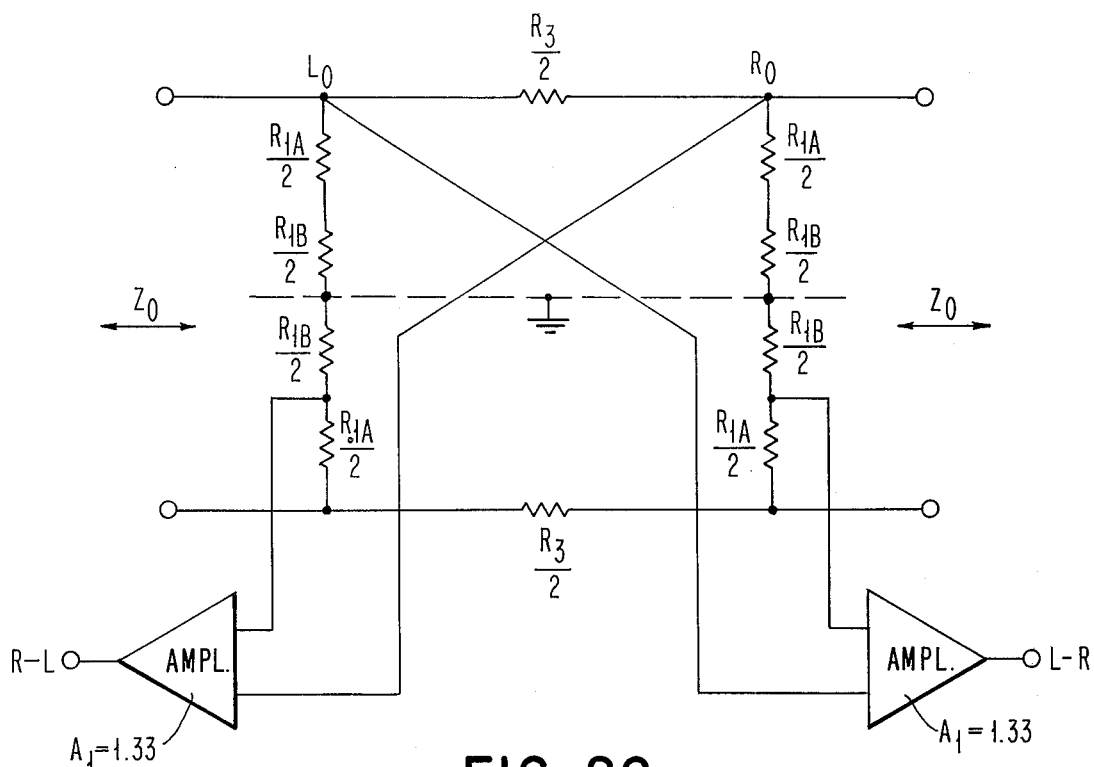
FIG. 2C illustrates an alternative embodiment of the invention employing a modified symmetrical O attenuator network and a pair of operational summing amplifiers.

While the particular numerical example illustrated in FIG. 2B employs a symmetrical $\pi$ attenuator network, it will be immediately obvious to those skilled in the art that this numerical example is equally applicable to a broad band directional coupling circuit employing a symmetrical O attenuator network as illustrated in FIG. 2C. However, in the example in FIG. 2C, operational summing amplifiers may be used in place of the differential amplifiers employed in the circuit in FIG. 2B. The use of operational summing amplifiers is permitted because of the use of the balanced attenuator network which provides both relatively positive and negative voltages at selected nodes within the network. This may be visualized by considering the ground, which may be either virtual or physical, between each of the pair of $R_{1B}/2$ impedances in each of the shunt arms of the attenuator network as indicated by the dotted line and ground connections. Above this ground at the nodes $L_o$ and $R_o$ the positive voltages are obtained for the operational amplifiers. The negative voltages for the operational amplifiers are of course obtained below this ground. Obviously, in a practical circuit, three of the series resistances in each of the shunt arms of the attenuator may be replaced by a single resistance having a value $$\frac{R_{1A} + 2R_{1B}}{2}.$$

It follows that the operation of the circuit of FIG. 2C is identical with that of FIGS. 2A and 2B.

As indicated previously, the value of the attenuation factor, $K = 2$, assumed in the foregoing description, is for some applications impractically large. Magnitudes of $R_{1A}$, $R_{1B}$, $R_3$, and $A_{DA}$ for other magnitudes of $K$ are shown in Table II.

TABLE II

| K | $R_{1A}(\Omega)$ | $R_{1B}(\Omega)$ | $R_3(\Omega)$ | $A_{DA}$ |
|---|---|---|---|---|
| 2.00 | 75.0 | 75.0 | 37.50 | 1.33 |
| 1.50 | 83.3 | 167 | 20.83 | 1.80 |
| 1.20 | 91.6 | 458 | 9.167 | 3.27 |
| 1.10 | 95.5 | 955 | 4.773 | 5.76 |
| 1.05 | 97.6 | 1952 | 2.440 | 10.76 |

The bandwidths of the circuits shown in FIGS. 2A, 2B and 2C will be limited by parasitic reactances associated with $R_1$, $R_{1A}$, $R_{1B}$, and $R_3$, and by the differential or operational amplifier bandwidth. In most cases, the amplifier bandwidth will be the dominant limitation.

Figure 3:
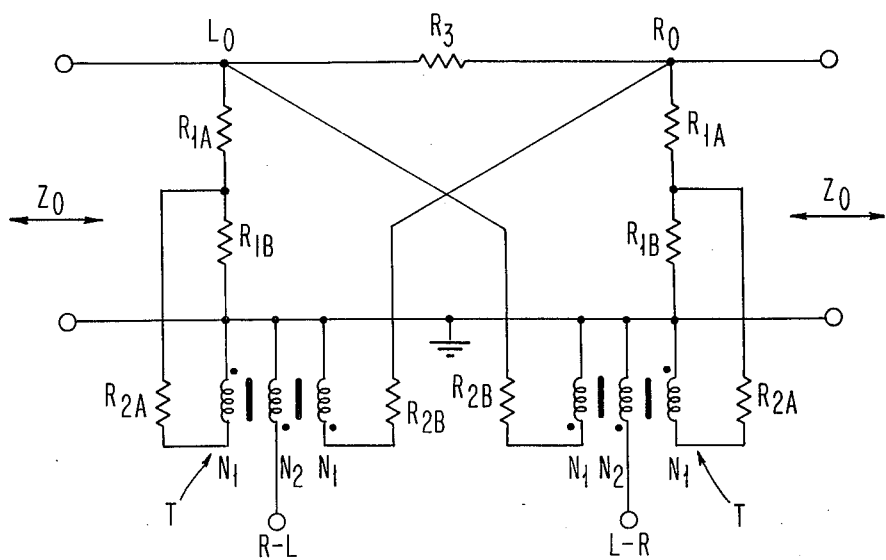
FIG. 3 is yet another illustrative embodiment of the invention comprised entirely of passive elements employing a modified symmetrical $\pi$ attenuator network and a pair of current transformers.

The circuits described with respect to FIGS. 2A, 2B, and 2C all require active devices, i.e., differential amplifiers or operational amplifiers. Where operation down to DC is not required and where a broadband directional coupler comprised entirely of passive elements, is desired, the embodiment shown in FIG. 3 may be used. It will be recognized that FIG. 3, like FIG. 2B, employs a modified symmetrical $\pi$ attenuator network. For purposes of illustration, it may be assumed that the attenuator networks of FIG. 3 and FIG. 2B are identical. In place of the differential amplifiers, a pair of current transformers, T, are used. Each of the current transformers has a pair of primary windings having the same number of turns, $N_1$, connected in opposite polarities. The transformers have a single secondary winding having a number of turns, $N_2$, such that the turns ratio, $$\frac{N_2}{N_1},$$

provide the desired voltage magnitude at nodes R-L and L-R. Assuming the above numerical example given for FIG. 2B, the turns ratio $N_2/N_1$ is equal to 1.33. The primary windings of the current transformers, T, are connected to the appropriate nodes of the attenuator network by current limiting resistors $R_{2A}$ and $R_{2B}$. In the circuit shown in FIG. 3 it will be understood that $R_{2A}$ and $R_{2B} >> R_{1A}$ and $R_{1B}$. The bandwidth and response of this circuit will, typically be determined by the characteristics of the current transformers T.

Figure 4A:
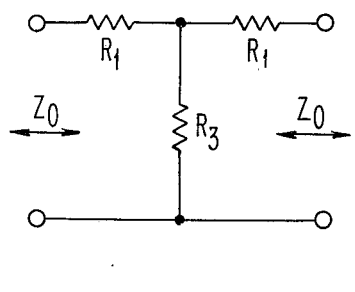
FIGS. 4A and 4B are circuit drawings of conventional, symmetrical T and H attenuator networks, respectively, which are used to illustrate the principles of the invention.
Figure 4B:
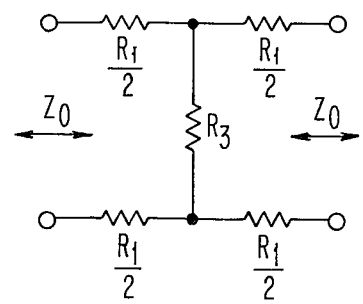

Next, referring to FIGS. 4A and 4B which show symmetrical T and H attenuator networks, the shunt resistance $R_3$ and the series resistances $R_1$ are calculated from the following equations:

$$R_3 = 2Z_0 \left(\frac{K}{K^2 - 1}\right), \text{ and} \tag{10}$$

$$R_1 = Z_0 \left(\frac{K-1}{K+1}\right) \tag{11}$$

Figure 5A:
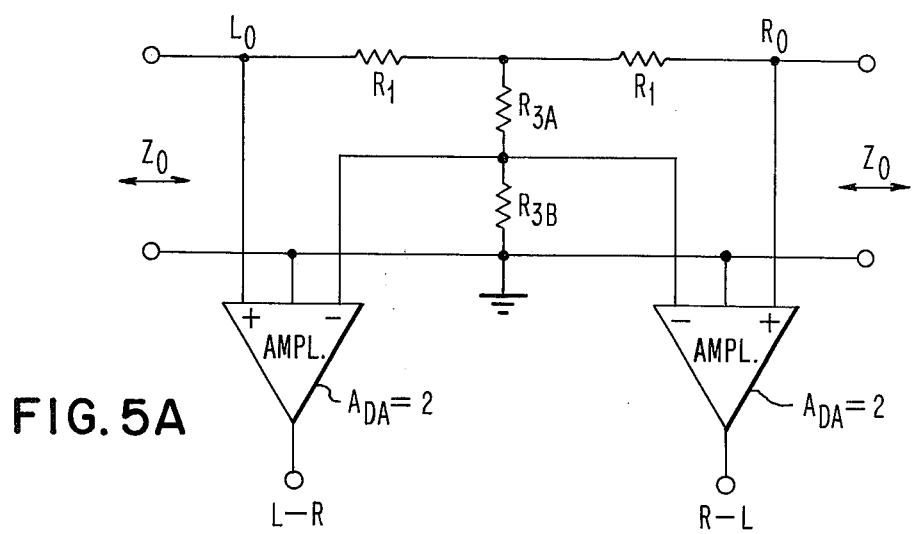
FIG. 5A illustrates a specific embodiment of the invention employing a modified symmetrical T attenuator network and a pair of differential amplifiers.
Figure 5B:
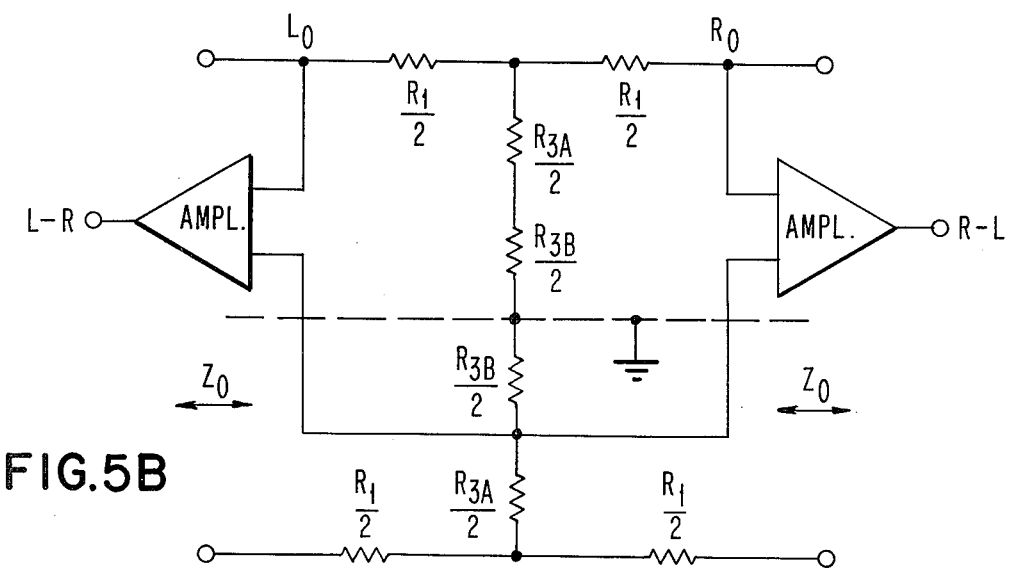
FIG. 5B illustrates an alternative embodiment of the invention employing a modified symmetrical H attenuator network and a pair of operational summing amplifiers.

By comparing equations (10) and (11) with equations (1) and (2), the analogy to the $\pi$ and O attenuator networks shown in FIGS. 1A and 1B is immediately obvious. Thus, the circuits shown in FIGS. 5A and 5B may be considered equivavalent to the circuits shown in FIGS. 2B and 2C, respectively. Clearly, a similar circuit for FIG. 2A is readily apparent from a comparison of the foregoing figures. In FIGS. 5A and 5B, the circuit values are calculated from the following equations:

$$R_{3A} + R_{3B} = R_3 \tag{12}$$

$$R_{3A} = R_{3B} \left(\frac{K-1}{K+1}\right), \tag{13}$$

$$R_{3A} = R_{3T} \left(\frac{K-1}{2K}\right) \tag{14}$$

$$R_{3B} = R_3 \left(\frac{K+1}{2K}\right), \text{ and} \tag{15}$$

$$A_{DA} = \frac{K}{K-1}. \tag{16}$$

Assuming $Z_0 = 50$ ohms and $K = 2$ as before, $R_3 = 66.7$ ohms, $R_1 = 16.67$ ohms, $R_{3B} = 50$ ohms, and $A_{DA} = 2$.

The circuits described have applications in analog and digital communications paths where two-way information flow exists and where a multiplicity of ports may share the same path. The use of these circuits will reduce the number of signal wires required between devices which communicate with each other. It should, however, be expressly understood that while the specific embodiments disclosed employed symmetrical $\pi$, O, T and H attenuator networks, the teachings of the invention are equally applicable to $\pi$, O T, and H attenuator networks which are not symmetrical, as will be obvious to those skilled in the art. It will therefore be apparent that the embodiments shown are only exemplary and that various modifications can be made in construction and arrangement within the scope of the invention as described in the appended claims.

What is claimed is:

1. A broad band directional coupling circuit for insertion in a single-signal path or transmission line in which signals are propagated simultaneously in opposite directions, comprising:
   a. an attenuator network employing linear, nonreactive impedance elements for insertion in said signal path or transmission line, said impedance elements forming at least first and second nodes;
   b. first signal combining means coupled to said first and second nodes for combining in a first predetermined ratio the signals at said first and second nodes to provide an output signal proportional to a signal propagating in a first direction only in said single-signal path or transmission line while providing substantially no output signal for a signal propagating in the opposite direction; and
   c. a second signal combining means coupled to said first and second nodes for combining in a second predetermined ratio the signals at said nodes to provide an output signal proportional to a second signal propagating in a second direction opposite to said first direction only in said single-signal path or transmission line while providing substantially no output signal for a signal propagating in said first direction.

2. A broad band directional coupling circuit as recited in claim 1 wherein said first and second signal combining means each comprise active devices.

3. A broad band directional coupling circuit as recited in claim 2 wherein said attenuator network is a $\pi$ attenuator network having a series impedance and first and second shunt impedances and the junction of said series impedance with said first shunt impedance defines said first node and the junction of said series impedance with said second shunt impedance defines said second node.

4. A broad band directional coupling circuit as recited in claim 3 wherein said first signal combining means provides differential amplification with a ratio of amplification factors corresponding to said first predetermined ratio of signals appearing at said first and second nodes, and said second signal combining means provides differential amplification with a ratio of amplification factors corresponding to said second predetermined ratio of signals appearing at said first and second nodes.

5. A broad band directional coupling circuit as recited in claim 4 wherein said first signal combining means comprises a first amplifier having a first amplification factor and a second amplifier having a second amplification factor, said first amplifier having its input connected to said first node and said second amplifier having its input connected to said second node, the outputs of said first and second amplifiers being coupled to a first output node, and wherein said second signal combining means comprises a third amplifier having a third amplification factor and a fourth amplifier having a fourth amplification factor, said third amplifier having its input connected to said second node and said fourth amplifier having its input connected to said first node, the outputs of said third and fourth amplifiers being coupled to a second output node.

6. A broad band directional coupling circuit as recited in claim 5 wherein said attenuator network is symmetrical, said first and third amplification factors are equal to an amplification factor, $A_1$, and said second and fourth amplification factors are equal to an amplification factor, $A_2$, said amplification factors being defined by the following equations:

$$A_1 = \frac{K^2}{K^2 - 1}, \text{ and}$$

$$A_2 = \frac{K}{K^2 - 1},$$

where $K$ is the attenuation factor of the attenuator network.

7. A broad band directional coupling circuit as recited in claim 4 wherein said first and second shunt impedances are each comprised of two series impedances, the junctions of said two series impedances each defining third and fourth nodes, respectively, and wherein said first signal combining means comprises a first differential amplifier having positive and negative inputs, the positive input of said first differential amplifier being connected to said first node and the negative input of said first differential amplifier being connected to said fourth node, and said second signal combining means comprises a second differential amplifier having positive and negative inputs, the positve input of said second differential amplifier being connected to said second node and the negative input of said second differential amplifier being connected to said third node.

8. A broad band directional coupling circuit as recited in claim 7 wherein said attenuator network is symmetrical and said two series impedances have values, $R_{1A}$ and $R_{1B}$, defined by the following equations:

$$R_{1A} = R_1 \left( \frac{K-1}{K} \right), \text{ and}$$

$$R_{1B} = R_1 \left( \frac{1}{K} \right),$$

where $R_1$ is the value of each of said first and second shunt impedances and $K$ is the attenuation factor of said attenuator network.

9. A broad band directional coupling circuit as recited in claim 2 wherein said attenuator netowrk is a O attenuator network having first and second series impedances and first and second shunt impedances, and the junction of said first series impedance with said first shunt impedance defines said first node and the junction of said first series resistance with said second shunt impedance defines said second node.

10. A broad band directional coupling circuit as recited in claim 9 wherein said first signal combining means provides differential amplification with a ratio of amplification factors corresponding to said first predetermined ratio of signals appearing at said first and second nodes, and said second signal combining means provides differential amplification with a ratio of amplification factors corresponding to said second predetermined ratio of signals appearing at said first and second nodes.

11. A broad band directional coupling circuit as recited in claim 10 wherein said first and second shunt impedances are each comprised of two series impedances, the junctions of said two series impedances each defining third and fourth nodes, respectively, and wherein said first signal combining means comprises a first summing amplifier having positive and negative inputs, the positive input of said first summing amplifier being connected to said first node and the negative input of said first summing amplifier being connected to said fourth node, and said second signal combining means comprises a second summing amplifier having positive and negative inputs, the positive input of said second summing amplifier being connected to said second node and the negative input of said second summing amplifier being connected to said third node.

12. A broad band directional coupling circuit as recited in claim 1 wherein said first and second signal combining means each comprise passive elements.

13. A broad band directional coupling circuit as recited in claim 12 wherein said attenuator network is a $\pi$ attenuator network having a series impedance and first and second shunt impedances and the junction of said series impedance with said first shunt impedance defines said first node and the junction of said series impedance with said second shunt impedance defines said second node.

14. A broad band directional coupling circuit as recited in claim 13 wherein said first signal combining means comprises a first current transformer having a secondary to primary turns ratio corresponding to said first predetermined ratio and said second signal combining means comprises a second current transformer having a secondary to primary turns ratio corresponding to said second predetermined ratio.

15. A broad band directional coupling circuit as recited in claim 2 wherein said attenuator network is a T attenuator network having a shunt impedance and first and second series impedances connected to a common node, said first series impedance being additionally connected to said first node and said second series impedance being additionally connected to said second node.

16. A broad band directional coupling circuit as recited in claim 15 wherein said first signal combining means provides differential amplification with a ratio of amplification factors corresponding to said first predetermined ratio of signals appearing at said first and second nodes, and said second signal combining means provides differential amplification with a ratio of amplification factors corresponding to said second predetermined ratio of signals appearing at said first and second nodes.

17. A broad band directional coupling circuit as recited in claim 16 wherein said shunt impedance is comprised of two series impedances, the junctions of said two series impedances defining a third node, and wherein said first signal combining means comprises a first differential amplifier having positive and negative inputs, the positve input of said first differential amplifier being connected to said first node and the negative input of said first differential amplifier being connected to said third node, and said second signal combining means comprises a second differential amplifier having positive and negative inputs, the positive input of said second differential amplifier being connected to said second node and the negative input of said second differential amplifier being connected to said third node.

18. A broad band directional coupling circuit as recited in claim 17 wherein said attenuator network is symmetrical and said two series impedances have values, $R_{3A}$ and $R_{3B}$, defined by the following equations:

$$R_{3A} = R_3 \left(\frac{K-1}{2K}\right), \text{ and}$$

$$R_{3B} = R_3 \left(\frac{K+1}{2K}\right)$$

where $R_3$ is the value of said shunt impedance and $K$ is the attenuation factor of said attenuation network.

19. A broad band directional coupling circuit as recited in claim 2 wherein said attenuator network is an H attenuator network having first and second series impedances and third and fourth series impedances and a shunt impedance, said shunt impedance being connected at one end to a first common junction with said first and second series impedances and at the other end to a second common junction with said third and fourth series impedances, said first series impedance being additionally connected to said first node and said second series impedance being additionally connected to said second node.

20. A broad band directional coupling circuit as recited in claim 19 wherein said first signal combining means provides differential amplification with a ratio of amplification factors corresponding to said first predetermined ratio of signals appearing at said first and second nodes, and said second signal combining means provides differential amplification with a ratio of amplification factors corresponding to said second predetermined ratio of signals appearing at said first and second nodes.

21. A broad band directional coupling circuit as recited in claim 20 wherein said shunt impedance is comprised of two series impedances, the junctions of said two series impedances defining a third node, and wherein said first signal combining means comprises a first summing amplifier having positiive and negative inputs, the positive input of said first summing amplifier being connected to said first node and the negative input of said first summing amplifier being connected to said third node, and said second signal combining means comprises a second summing amplifier having positive and negative inputs, the positve input of said second summing amplifier being connected to said second node and the negative input of said second summing amplifier being connected to said third node.

* * * * *

UNITED STATES PATENT AND TRADEMARK OFFICE
CERTIFICATE OF CORRECTION

PATENT NO. : 3,934,213
DATED : January 20, 1976
INVENTOR(S) : Paul E. Stuckert

It is certified that error appears in the above-identified patent and that said Letters Patent are hereby corrected as shown below:

Column 1, line 47 - delete "When" and insert --Where--

Column 2, line 57 - delete "netowrk" insert --network-- line 67 - delete "unit" and insert --unity--

Column 5, line 47 - delete "$R_{2A}$ and R2B" insert --$R_{2A}$ and $R_{2B}$--

Column 6, line 9 - delete "$R_{37}$" and insert --$R_3$--;
in equation 14 insert comma after closing parenthesis.

line 17 - after "16.67 ohms," insert -$R_{3A}$ = 16.7 ohms, --

Signed and Sealed this
fifteenth Day of June 1976

[SEAL]

Attest:

RUTH C. MASON
*Attesting Officer*

C. MARSHALL DANN
*Commissioner of Patents and Trademarks*